United States Patent
Li et al.

(10) Patent No.: US 7,407,858 B2
(45) Date of Patent: *Aug. 5, 2008

(54) RESISTANCE RANDOM ACCESS MEMORY DEVICES AND METHOD OF FABRICATION

(75) Inventors: Tingkai Li, Vancouver, WA (US); Sheng Teng Hsu, Camas, WA (US); David R. Evans, Beaverton, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 282 days.

This patent is subject to a terminal disclaimer.

(21) Appl. No.: 11/403,020

(22) Filed: Apr. 11, 2006

(65) Prior Publication Data

US 2007/0238246 A1 Oct. 11, 2007

(51) Int. Cl.
*H01L 21/336* (2006.01)
*H01L 31/072* (2006.01)

(52) U.S. Cl. .................................. 438/261; 257/22
(58) Field of Classification Search .............. 438/3, 438/240, 261, 287; 257/314–317, 20–24
See application file for complete search history.

(56) References Cited

U.S. PATENT DOCUMENTS

| | | | |
|---|---|---|---|
| 6,927,120 B2 * | 8/2005 | Hsu et al. | 438/240 |
| 6,972,239 B1 * | 12/2005 | Li et al. | 438/384 |
| 7,098,101 B1 * | 8/2006 | Li et al. | 438/238 |

* cited by examiner

*Primary Examiner*—Calvin Lee
(74) *Attorney, Agent, or Firm*—David C. Ripma

(57) ABSTRACT

A method of fabricating a RRAM includes preparing a substrate and forming a bottom electrode ori the substrate. A PCMO layer is deposited on the bottom electrode using MOCVD or liquid MOCVD, followed by a post-annealing process. The deposited PCMO thin film has a crystallized PCMO structure or a nano-size and amorphous PCMO structure. A top electrode is formed on the PCMO layer.

12 Claims, 9 Drawing Sheets

US 7,407,858 B2

RESISTANCE RANDOM ACCESS MEMORY DEVICES AND METHOD OF FABRICATION

FIELD OF THE INVENTION

This invention relates to device structures, materials and processes of resistive random access memory devices (RRAM), and specifically to the use of thin films materials having microstructures, and processes for RRAM applications.

BACKGROUND OF THE INVENTION

Materials having bipolar and unipolar switching properties can be used for resistive random access memory devices (RRAM). The specific identity of such materials and the kinds of device structures, microstructures and phases which will exhibit such bipolar or unipolar switching properties is not yet fully known. In this invention, bipolar or unipolar switching properties are obtained by controlling microstructures of PCMO thin films using MOCVD and post-annealing processes.

SUMMARY OF THE INVENTION

A method of fabricating a RRAM includes preparing a substrate and forming a bottom electrode on the substrate. A PCMO layer is deposited on the bottom electrode using MOCVD or liquid MOCVD, followed by a post-annealing process. The deposited PCMO thin film has a crystallized PCMO structure or a nano-size and amorphous PCMO structure. A top electrode is formed on the PCMO layer.

It is an object of the invention to obtain bipolar and unipolar switching properties from a microstructure PCMO thin film.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

Many materials such as $Pr_{1-x}Ca_xMnO_3$ (PCMO) exhibit reversible resistive switching properties, which may be used for low power, low operation voltage, high speed and high-density memory applications. Based on the mechanism of reversible resistive switching properties, crystallized PCMO materials have been found to exhibit have bipolar switching properties, and nano-size PCMO materials shows unipolar switching properties. In this invention, bipolar and unipolar switching properties are obtained by controlling the microstructure of PCMO thin films for random access memory (RRAM) device applications using MOCVD and post-annealing processes.

Figure 1:
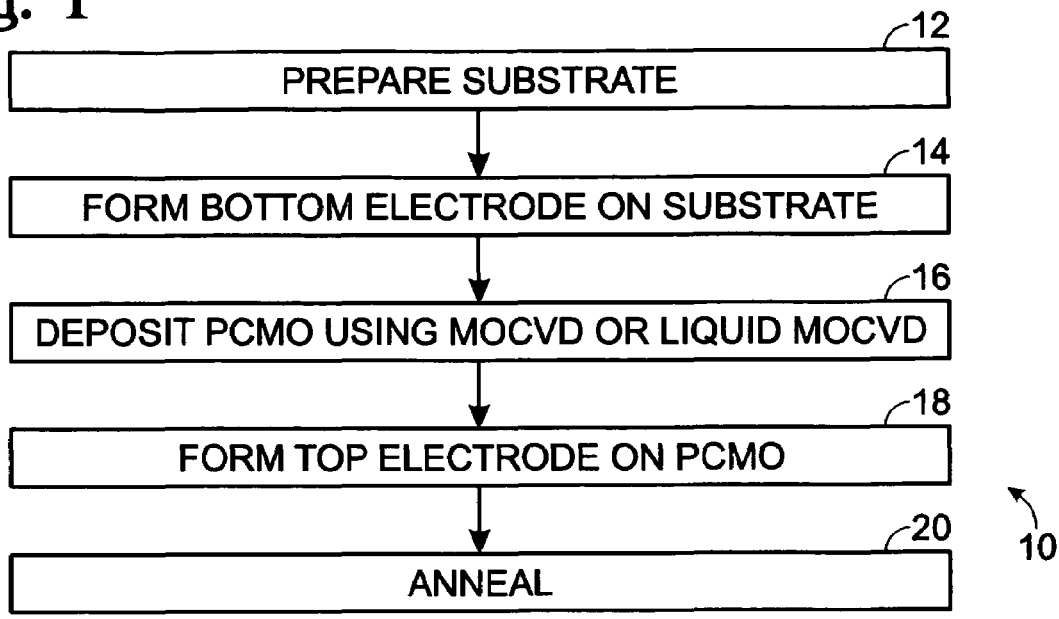
FIG. 1 is a block diagram of the method of the invention.

FIG. 1 depicts the method of the invention, generally at 10. A substrate is prepared, step 12, and a bottom electrode formed thereon, step 14. In most embodiments of the method of the invention, the substrate is a silicon substrate with a layer of SiO$_2$ formed thereon. A layer of titanium may be deposited before the formation of the bottom electrode. A layer of PCMO is deposited on the bottom electrode, step 16, which includes deposition at a temperature of between about 300° C. to 600° C., and a post-annealing process, in some instances, at a temperature of between about 400° C. to 500° C. Several techniques for depositing and manipulating the PCMO layer are described herein. A top electrode is formed on the PCMO, step 18. In some instances, the RRAM is annealed, step 20.

Figure 2:
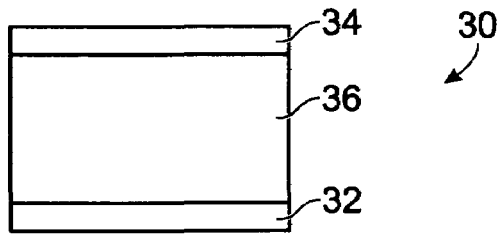
FIG. 2 depicts the basic structure of a RRAM device unit.

A typical RRAM device unit is shown in the FIG. 2, generally at 30. The units have a sandwich-like structure, which includes a top electrode 32, a bottom electrode 34, and a thin film 36, sandwiched between the top and bottom electrodes. The thin films may be crystallized or nano-size materials which include elements having valence change characteristics.

RRAM Devices with Crystallized PCMO Thin Films.

Figure 3:
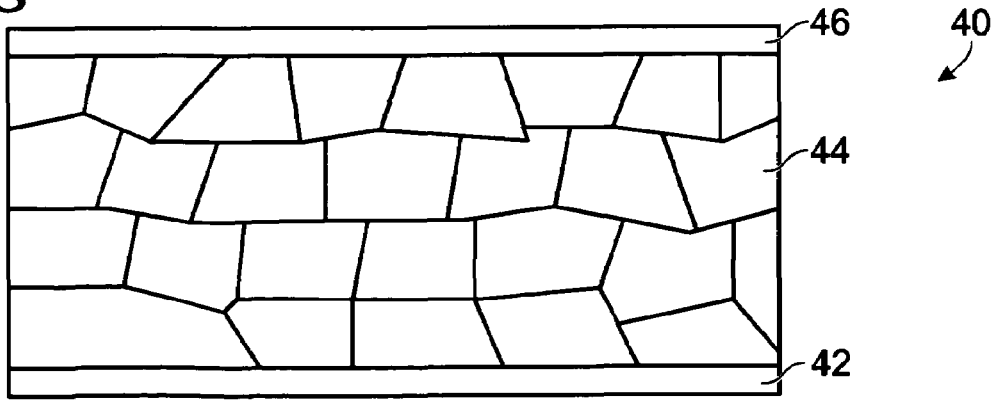
FIG. 3 depicts a RRAM device having a crystallized PCMO thin film.

A RRAM device 40, having a crystallized PCMO thin films, as shown in FIG. 3, generally at 40, and includes a bottom electrode 42, the PCMO layer 44 and a top electrode 46. For crystallized PCMO thin films, the grain boundaries are very small. The resistance depends on PCMO grains. The reversible resistive switching properties of PCMO materials come from electron traps and double exchange interactions of $Mn^{3+}$—$O^{2-}$—$Mn^{4+}$, which describes atom ordering and orientation. The double exchange interactions of $Mn^{3+}$—$O^{2-}$—$Mn^{4+}$ also cause a volume change and an oxygen atom shift. Based on the double exchange mechanism, perfect and oriented PCMO crystallized thin films should demonstrate the best bipolar switching properties.

Figure 4:
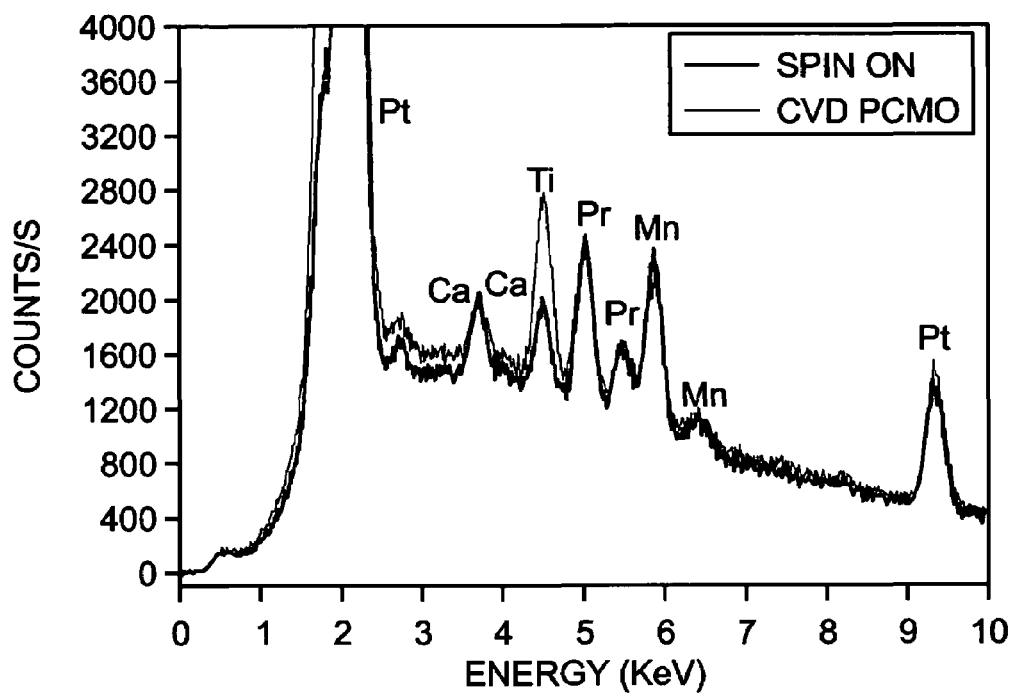
FIG. 4 depicts EDX patterns of PCMO thin films using MOCVD processes.

According to above modeling, a structure having a platinum bottom electrode, a crystallized PCMO thin film, and a platinum top electrode was fabricated. The experimental results are consistent with the above theoretical modeling. FIG. 4 shows the EDX patterns of PCMO thin films deposited on Pt/Ti/SiO$_2$/Si wafers using a MOCVD deposition process. Based on the Pr, Ca and Mn peaks, the PCMO composition is close to $Pr_{0.7}Ca_{0.3}MnO_3$.

Figure 5:
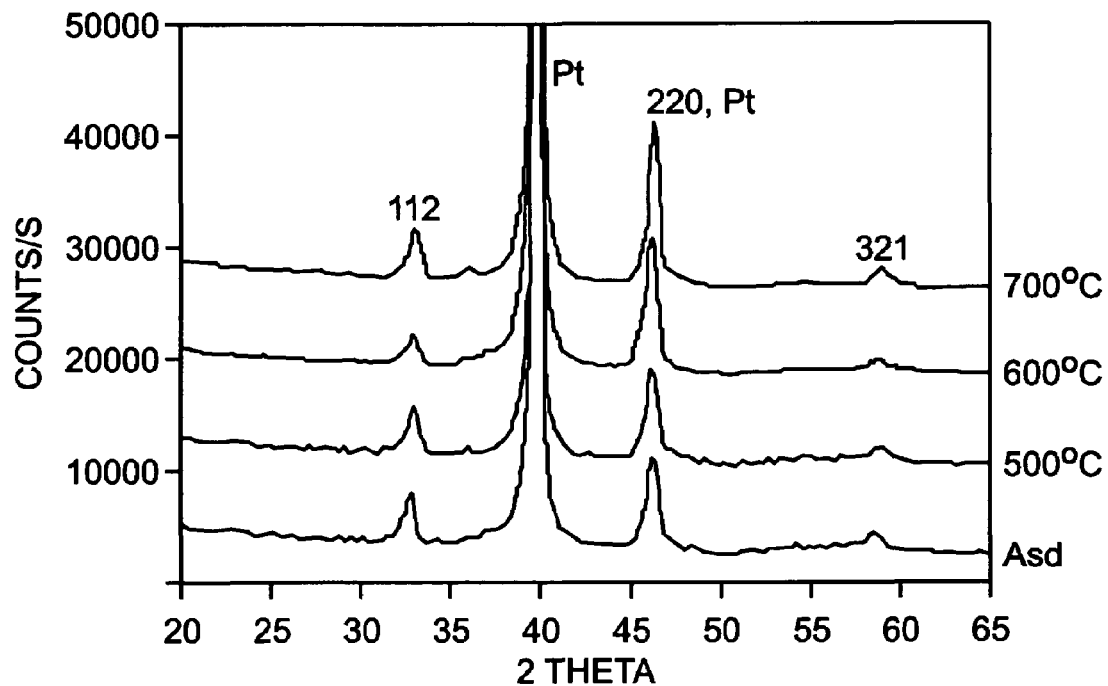
FIG. 5 is an X-ray pattern(s) of PCMO thin films using MOCVD deposition and post-annealing processes.
Figure 6:
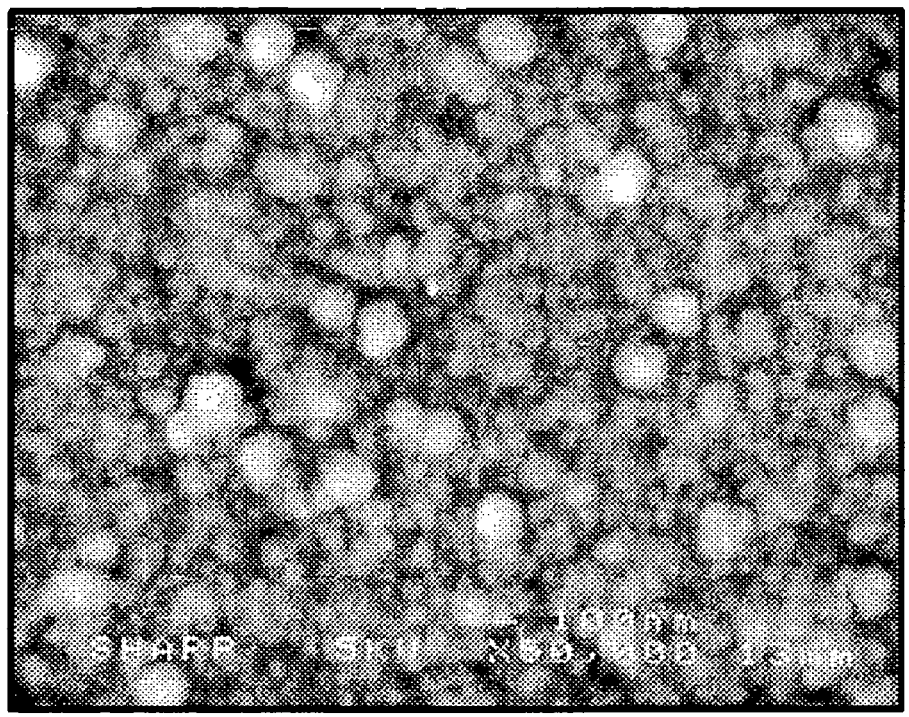
FIG. 6-9 depicts the microstructures of PCMO thin films using MOCVD deposition and post-annealing processes at various temperatures and times.
Figure 7:
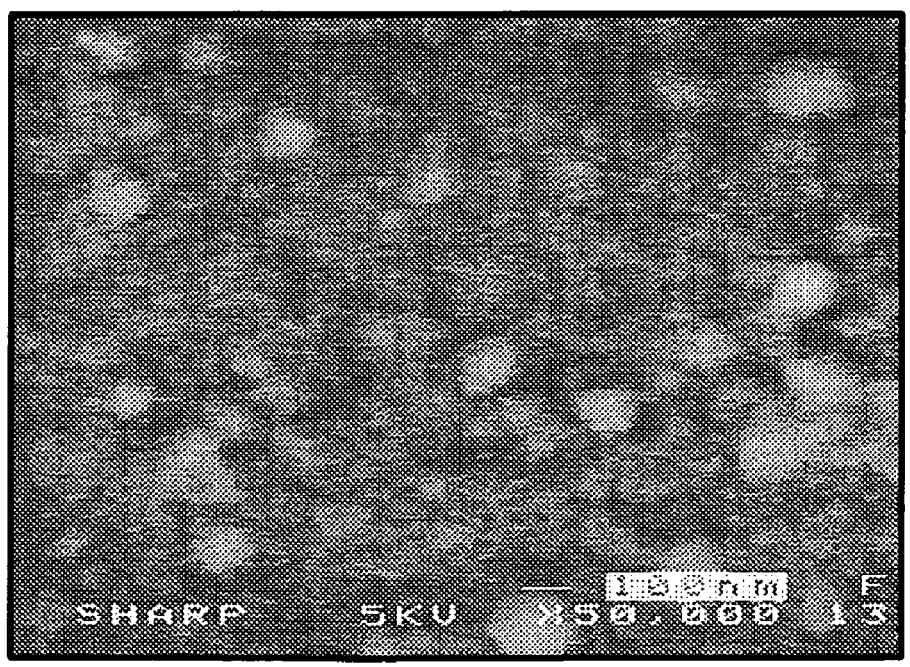
Figure 8:
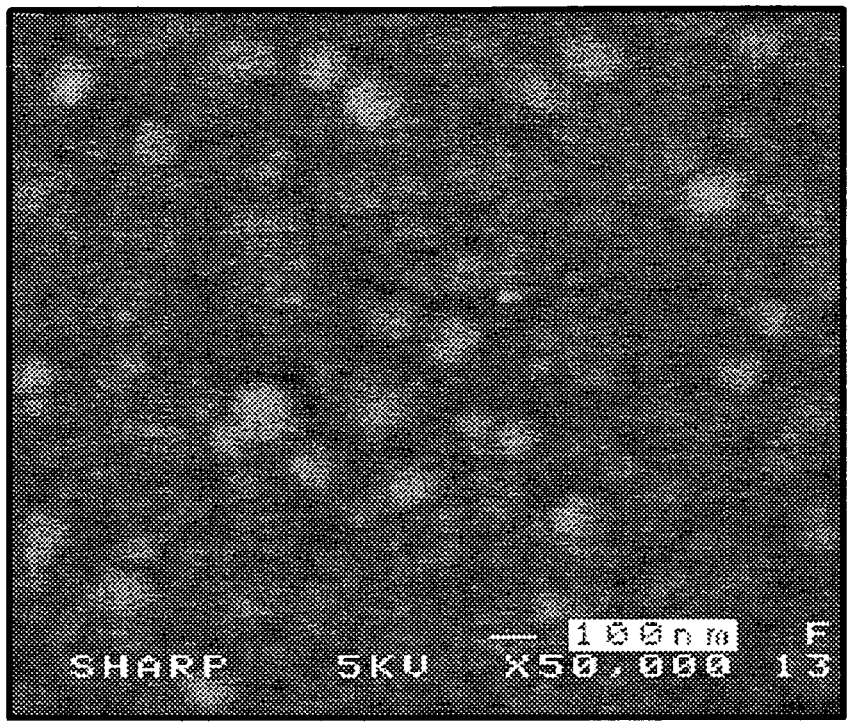
Figure 9:
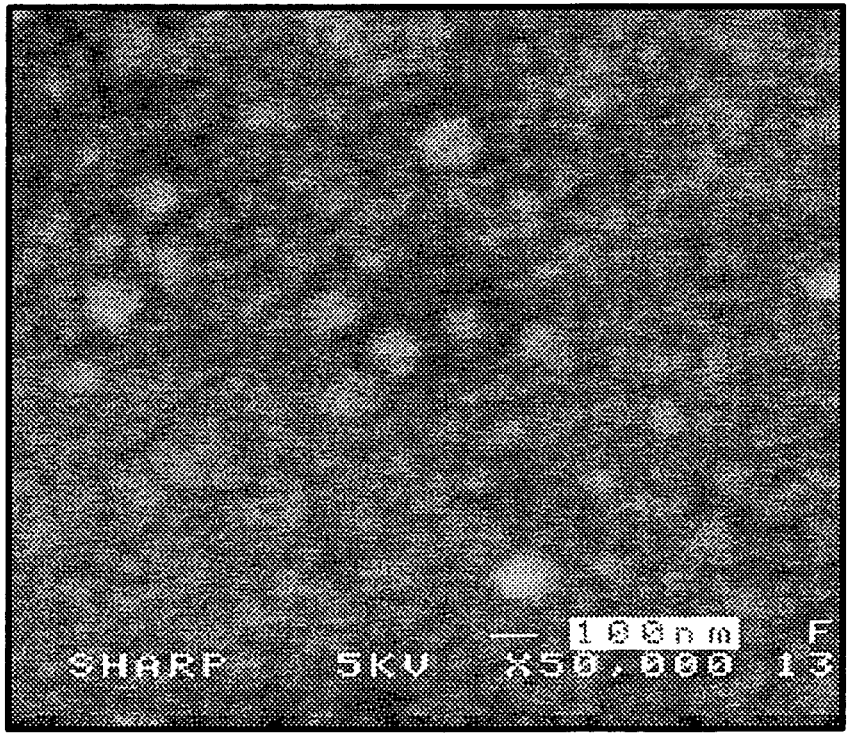

FIG. 5 shows the x-ray patterns of PCMO thin films on Pt/Ti/SiO$_2$/Si wafers using the previously described MOCVD process, wherein the PCMO thin film is deposited at a temperature of 450° C. for thirty minutes. As is shown in the figures, single-phase PCMO thin films were obtained. However, post-annealing does not appear to provide any significant improvement on the crystallization of PCMO thin films, using this deposition technique.

FIGS. 6-9 depict the microstructure of PCMO thin film deposited on Pt/Ti/SiO$_2$/Si wafers and post-annealed as deposited (FIG. 6), and at 500° C. (FIG. 7), 600° C. (FIG. 8), 700° C. (FIG. 9) anneal for 5 minutes, respectively, measured by SEM. After post-annealing, the grain size of PCMO thin film increase from about 0.1 μm to about 0.15 μm.

Figure 10:
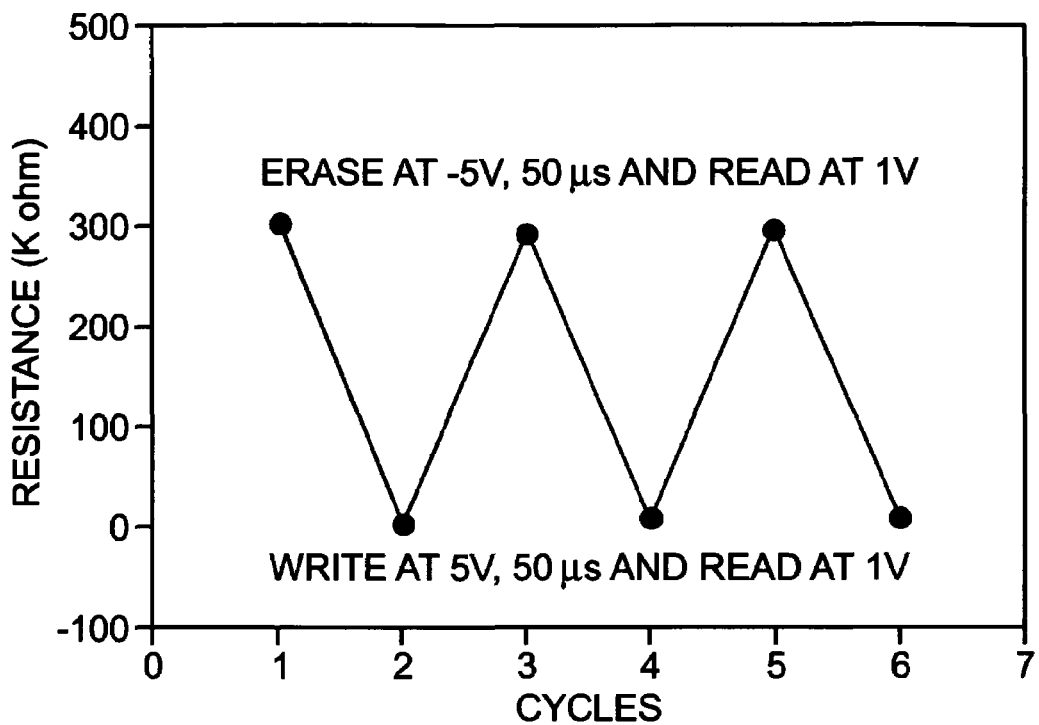
FIGS. 10 and 11 depict the bipolar switching properties of PCMO thin films, deposited on Pt/Ti/SiO$_2$/Si wafers using MOCVD deposition processes, using various pulse lengths.
Figure 11:
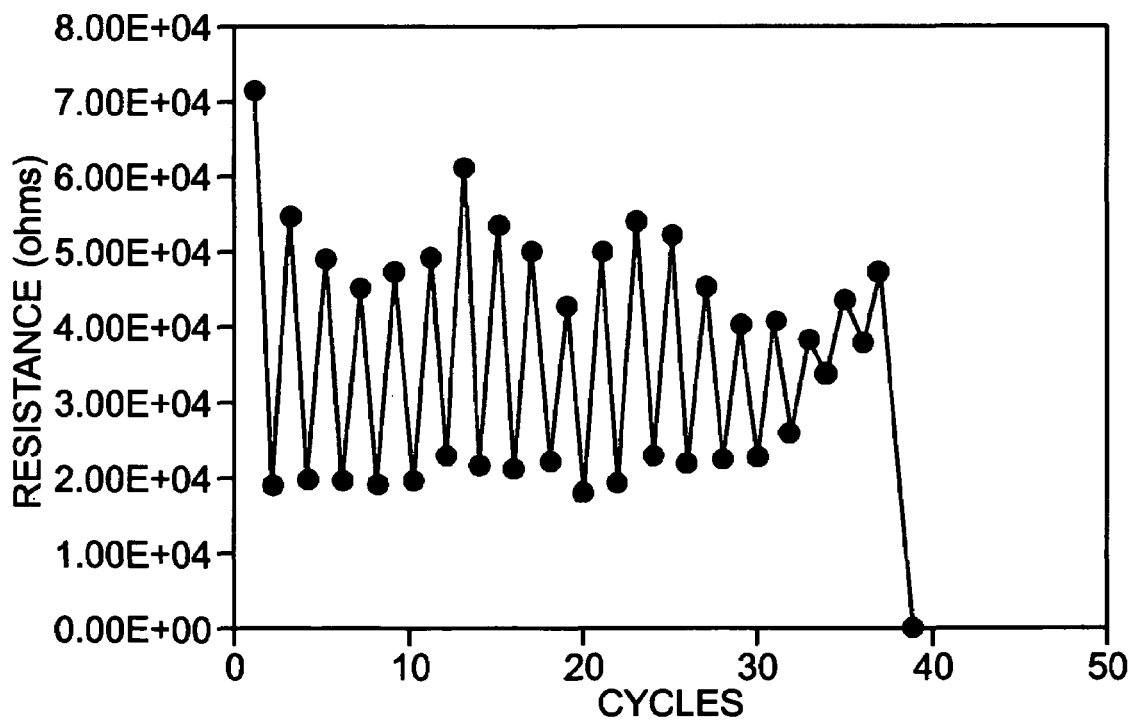

FIGS. 10 and 11 depicts the bipolar switching properties of PCMO thin films deposited on Pt/Ti/SiO$_2$/Si wafers using the previously described MOCVD deposition process prior to annealing. As is shown in the figures, the ratio of higher resistance to lower resistance is about 2 orders of magnitude, but using longer pulse, as shown in FIG. 10. If a short pulse is used, the ratio of higher resistance to lower resistance decreases, as shown in FIG. 11.

Figure 12:
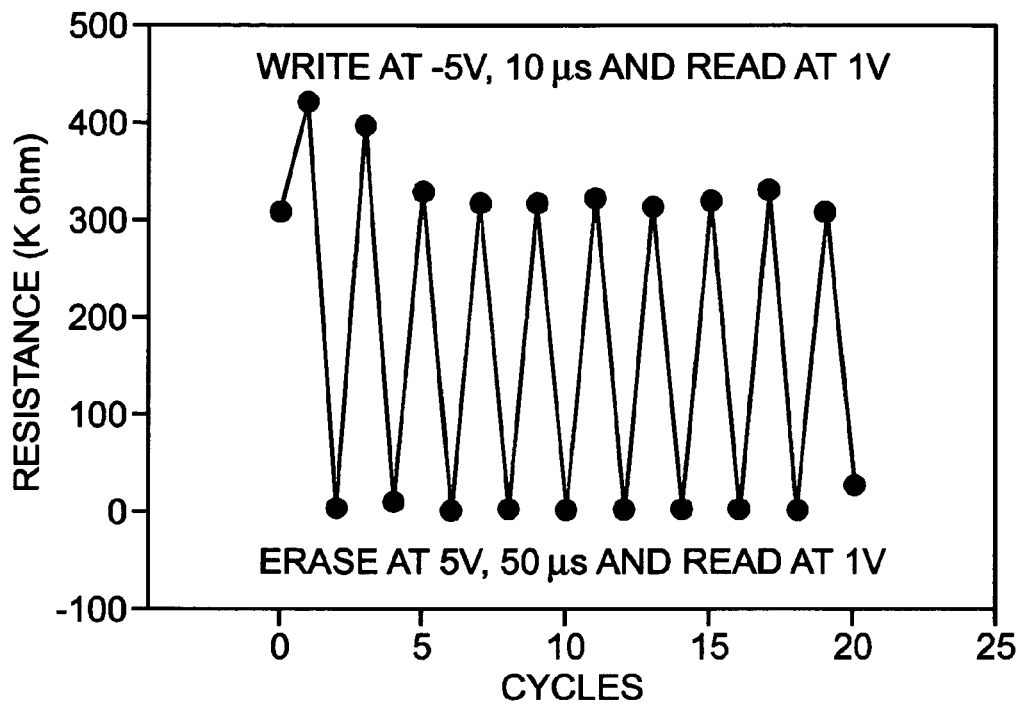
FIG. 12 depicts the bipolar switching properties of PCMO thin films deposited on Pt/Ti/SiO$_2$/Si wafers using MOCVD deposition processes and a post-annealing process.

FIG. 12 depicts the bipolar switching properties of a PCMO thin film deposited on Pt/Ti/SiO$_2$/Si wafers using MOCVD deposition processes, which demonstrates that after post-annealing at 500° C. for 5 minutes, the PCMO thin films show very little improvement in the switching characteristics.

RRAM Devices with Nano-size and Amorphous PCMO Thin Films.

Figure 13:
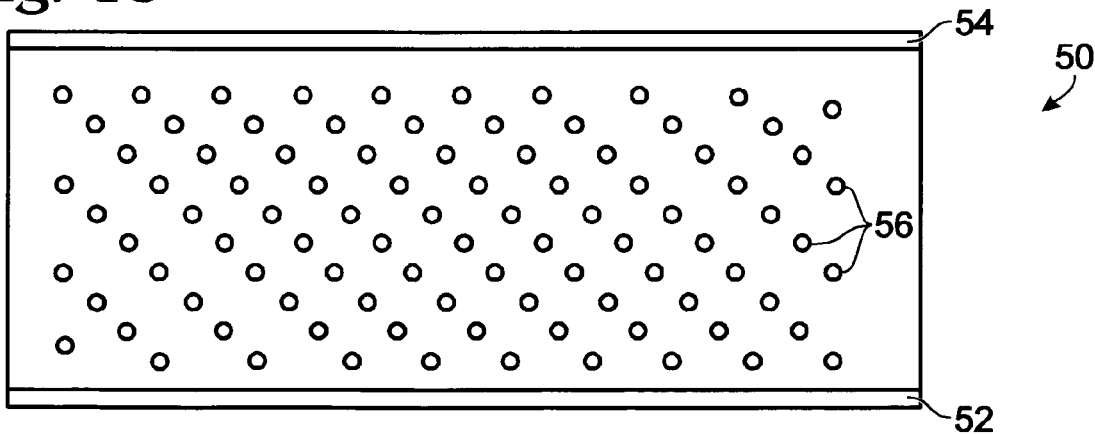
FIG. 13 depicts a RRAM device having a nano-size PCMO thin film.
Figure 14:
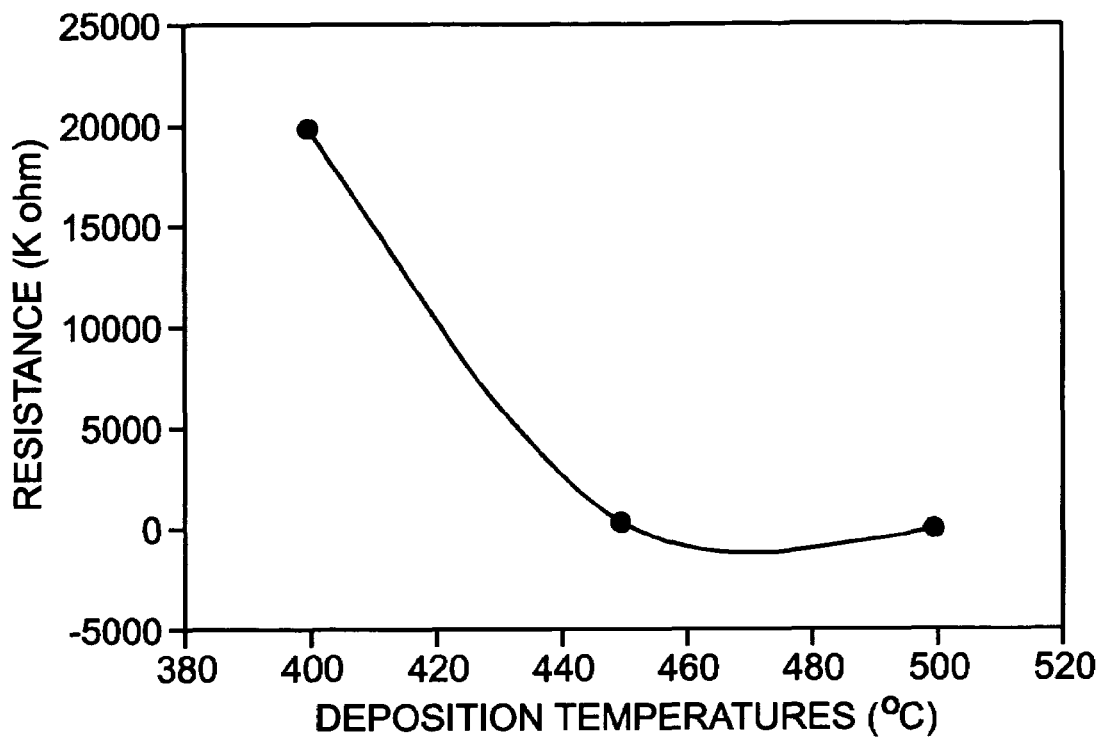
FIG. 14 depicts resistance decrease with increasing deposition temperatures of PCMO thin films.

A RRAM device having a with nano-size PCMO thin films is shown in FIG. 13, generally at 50. Again, the RRAM has a bottom electrode 52, a top electrode 54 and a PCMO layer 56. For nano size PCMO thin films, the grain boundaries or amorphous matrix have a higher resistance than that of nano size grains, as shown in FIG. 14, which depicts resistance decrease with increasing deposition temperatures of PCMO thin films having a composition of $Pr_{0.71}Ca_{0.29}Mn_{0.91}O$. With increasing deposition temperature, PCMO thin films change from amorphous, nano-size PCMO to crystallized PCMO thin films. The resistance of PCMO thin films also decreases with increasing deposition temperatures. Therefore, the reversible resistive switching properties of nano-size PCMO materials mostly come from electron traps and transfers between nano-size grains and an amorphous matrix, which is affected by concentration and distribution of defects. Based on the double exchange mechanism, nano-size PCMO thin films will exhibit unipolar switching properties.

Figure 15:
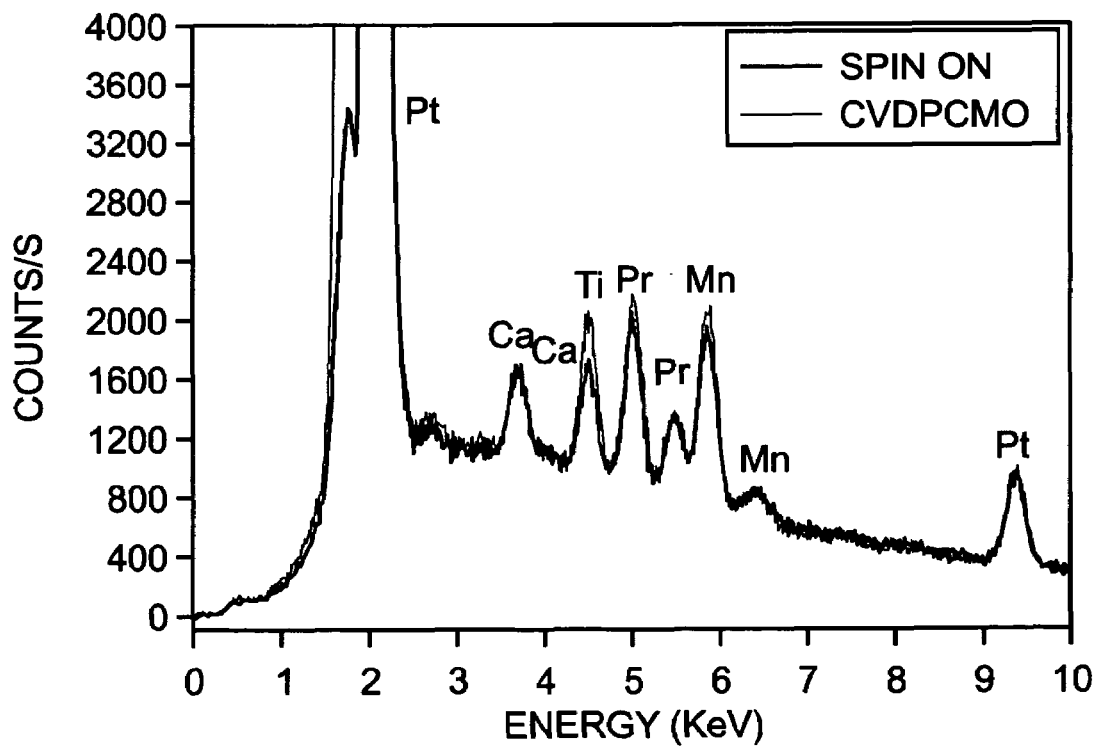
FIG. 15 depicts EDX patterns of nano-size PCMO thin films deposited on Pt/Ti/SiO$_2$/Si wafers using liquid delivery MOCVD processes.

FIG. 15 shows the EDX patterns of nano-size PCMO thin films deposited on Pt/Ti/SiO$_2$/Si wafers using a liquid delivery MOCVD processes. Using spin-on PCMO thin films as a reference, EDS measurements demonstrate that the composition of the PCMO thin film is close to $Pr_{0.7}Ca_{0.3}MnO_3$ according to the observed Pr, Ca and Mn peaks.

Figure 16:
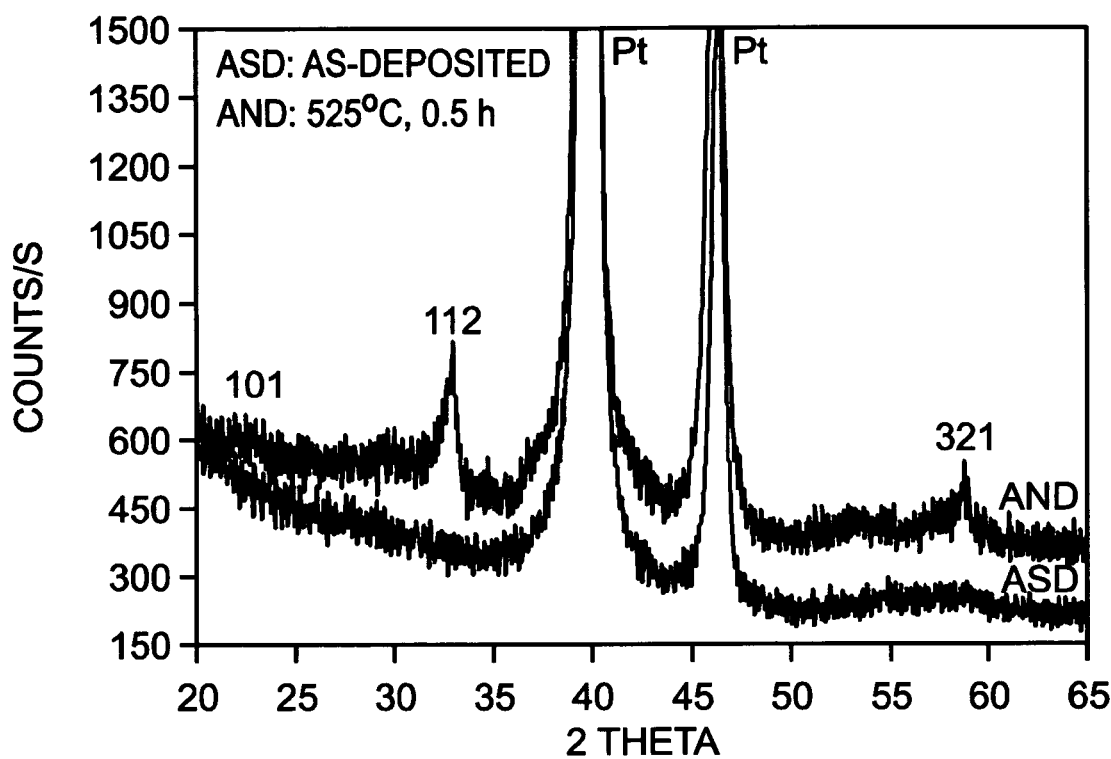
FIG. 16 depicts X-ray patterns of PCMO thin films as deposited at 400° C. and annealed at 525° C.

FIG. 16 shows the x-ray patterns of MOCVD PCMO thin films formed on a Pt/Ti/SiO$_2$/Si wafer. The as-deposited PCMO thin film, deposited at a vaporizer temperature of about 270° C. and a substrate temperature of about 400° C. demonstrate a nano-size PCMO phase. After rapid thermal annealing at about 525° C. for about thirty minutes, the smaller 112 and 321 peaks appear, which means that the concentration of nano-size grains of PCMO have increased in the thin film. X-ray patterns of PCMO thin films as deposited at 400° C. and annealed at 525° C.

Figure 17:
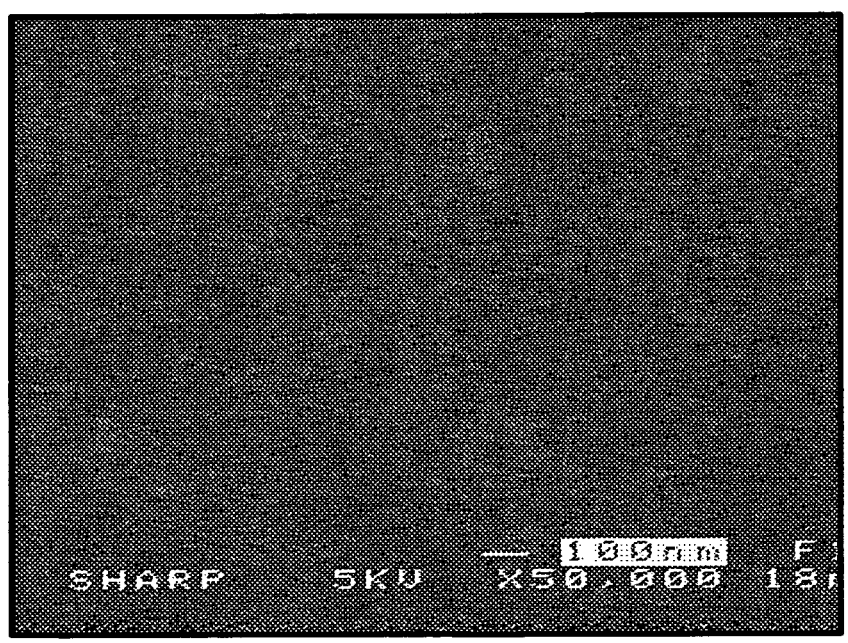
FIG. 17 depicts the microstructure of nano size PCMO thin films.

FIG. 17 is a SEM photo of the microstructure of a nano-size PCMO thin film. Because of the very small grain size, the SEM photo displays a very smooth surface morphology.

Figure 18:
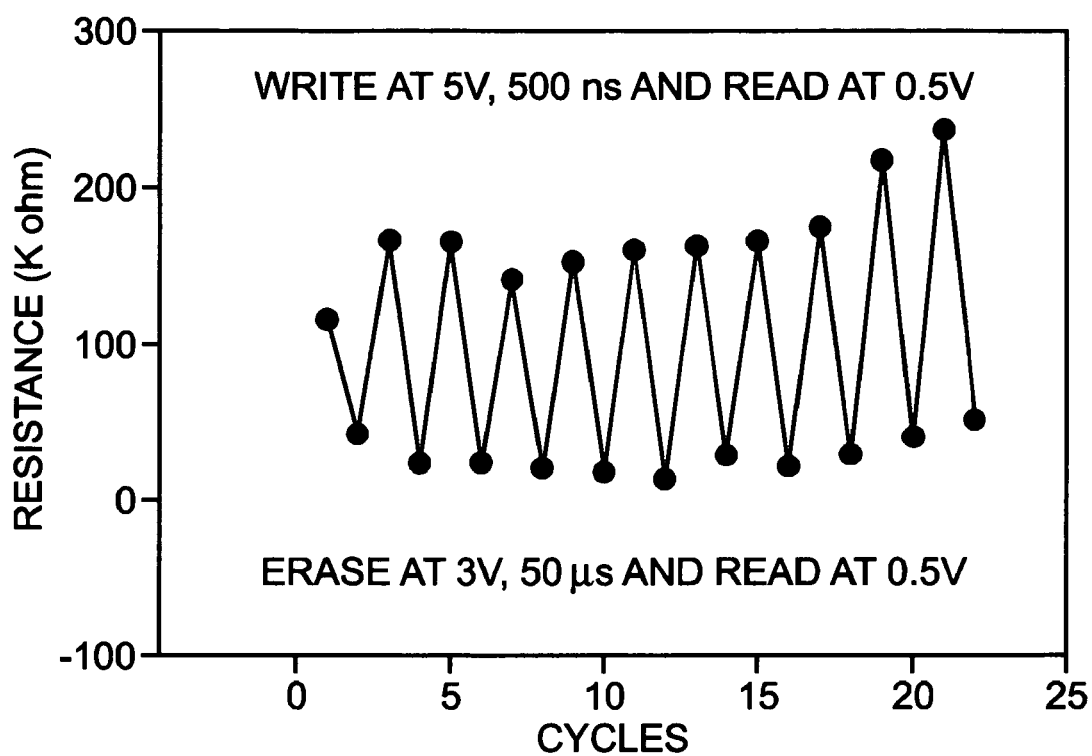
FIG. 18 depicts the unipolar switching properties of nano size PCMO thin films deposited on Pt/Ti/SiO$_2$/Si wafers using MOCVD and rapid thermal annealing.

FIG. 18 depicts the unipolar switching properties of nano size PCMO thin films deposited on Pt/Ti/SiO$_2$/Si wafers using MOCVD and rapid thermal annealing processes. As is shown in the figures, the ratio of higher resistance to lower resistance is about 1 order of magnitude.

Based on above experimental results, in the RRAM device unit structures, between two electrodes, the thin films can be crystallized or nano-size materials having element with valence changes. If the thin films are crystallized materials including epitaxial and oriented thin films, the device will show bipolar switching properties. If the thin films are nano-size or amorphous materials, the devices will have unipolar switching properties. PCMO thin films may be found in both crystalline and amorphous nano-size forms using the MOCVD and post-annealing process of the method of the invention.

Thus, a method for fabricating a RRAM having a microstructure PCMO thin film therein has been disclosed. It will be appreciated that further variations and modifications thereof may be made within the scope of the invention as defined in the appended claims.

We claim:

1. A method of fabricating a RRAM, comprising:
   preparing a substrate;
   forming a bottom electrode on the substrate;
   depositing a PCMO layer on the bottom electrode, wherein said depositing is taken from the group of deposition methods consisting of MOCVD and liquid MOCVD, and wherein the PCMO thin film has a crystallized PCMO structure or a nano-size and amorphous PCMO structure;
   post-annealing the substrate, bottom electrode and PCMO layer; and
   forming a top electrode on the PCMO layer.

2. The method of claim 1 which includes annealing the RRAM.

3. The method of claim 2 where said annealing depositing a PCMO layer includes depositing the PCMO layer at a deposition temperature of greater than 440° C. and wherein said annealing includes annealing at a temperature greater than 500° C.

4. The method of claim 1 wherein said depositing a PCMO layer having a crystalline PCMO structure includes depositing a PCMO layer having a grain size of between about 0.1 μm and 0.15 μm.

5. The method of claim 1 wherein said preparing a substrate includes preparing a silicon substrate having a layer of silicon oxide thereon, and which further includes depositing a layer of titanium on the silicon oxide before said depositing a bottom electrode; and wherein said depositing a bottom electrode and said depositing a top electrode include depositing top and bottom platinum electrodes.

6. A method of fabricating a RRAM, comprising:
   preparing a substrate;
   forming a bottom electrode on the substrate;
   depositing a PCMO layer on the bottom electrode, wherein said depositing is taken from the group of deposition methods consisting of MOCVD and liquid MOCVD, depositing the PCMO layer at a deposition temperature of between about 300° C. to 440° C., and wherein the PCMO thin film has a nano-size and amorphous PCMO structure;
   forming a top electrode on the PCMO layer; and
   annealing the RRAM.

7. The method of claim 6 where said annealing includes annealing at a temperature greater than 450° C.

8. The method of claim 6 wherein said depositing a PCMO layer having a nano-size and amorphous PCMO structure includes depositing a PCMO layer having a grain size of less than 100 nm.

9. The method of claim 6 wherein said preparing a substrate includes preparing a silicon substrate having a layer of silicon oxide thereon, and which further includes depositing a layer of titanium on the silicon oxide before said depositing a bottom electrode; and wherein said depositing a bottom electrode and said depositing a top electrode include depositing top and bottom platinum electrodes.

10. A method of fabricating a RRAM, comprising:
preparing a silicon substrate;
forming a layer of silicon oxide on the silicon substrate;
depositing a layer of titanium on the silicon oxide;
forming a platinum bottom electrode on the substrate;
depositing a PCMO layer on the platinum bottom electrode, wherein said depositing is taken from the group of deposition methods consisting of MOCVD and liquid MOCVD, depositing the PCMO layer at a deposition temperature of between about 300° C. to 600° C., and wherein the PCMO thin film has a crystallized PCMO structure or a nano-size and amorphous PCMO structure;
forming a platinum top electrode on the PCMO layer; and
annealing the RRAM.

11. The method of claim 10 where said annealing includes annealing at a temperature greater than 500° C.

12. The method of claim 10 wherein said depositing a PCMO layer having a nano-size and amorphous PCMO structure includes depositing a PCMO layer having a grain size of less than 100 nm and a crystalline PCMO layer has a grain size of between about 0.1 μm and 0.15 μm.

* * * * *